United States Patent [19]

Blum

[11] Patent Number: 4,674,442
[45] Date of Patent: Jun. 23, 1987

[54] PROCESS AND APPARATUS FOR PRODUCING HIGH PURITY OXIDATION ON A SEMICONDUCTOR SUBSTRATE

[75] Inventor: Samuel E. Blum, White Plains, N.Y.

[73] Assignee: International Business Machines Corporation, Armonk, N.Y.

[21] Appl. No.: 864,926

[22] Filed: May 20, 1986

Related U.S. Application Data

[62] Division of Ser. No. 786,194, Oct. 10, 1985, Pat. No. 4,606,935.

[51] Int. Cl.⁴ .......................................... H01L 21/316
[52] U.S. Cl. ..................................... 118/719; 118/724
[58] Field of Search ................................ 118/719, 724

[56] References Cited

U.S. PATENT DOCUMENTS

| | | | |
|---|---|---|---|
| 3,297,411 | 1/1967 | Dear | 23/284 |
| 4,123,229 | 10/1978 | Carman | 422/199 |
| 4,258,658 | 3/1981 | Polityck | 118/724 |
| 4,347,431 | 8/1982 | Pearce et al. | 219/390 |

FOREIGN PATENT DOCUMENTS 2082384  3/1982  United Kingdom .

OTHER PUBLICATIONS

J. Electrochem. Soc., Solid-State Science and Technology, Jan. 1983, Bell Laboratories, Allentown, Pennsylvania 18103, Paul F. Schmidt, "Contamination-Free High Temperature Treatment of Silicon or Other Materials", pp. 196–199.

Primary Examiner—John D. Smith
Attorney, Agent, or Firm—Pollock, Vande Sande & Priddy

[57] ABSTRACT

High purity oxidation is produced on a semiconductor substrate. The process includes heating the semiconductor substrate in the presence of an oxidizing ambient in a multi-walled reaction chamber containing a heating element. A halogen-containing ambient flows in an outer portion of the reaction chamber intermediate between the inner portion and the heating element to react with heating element contaminant. In a portion of the reaction chamber position intermediate of the inner portion and the outer portion, a gaseous ambient flows to remove water by-product from the reaction with the halogen which occurs in the outer portion of the reaction chamber. The apparatus for carrying out the above process is also provided.

9 Claims, 1 Drawing Figure

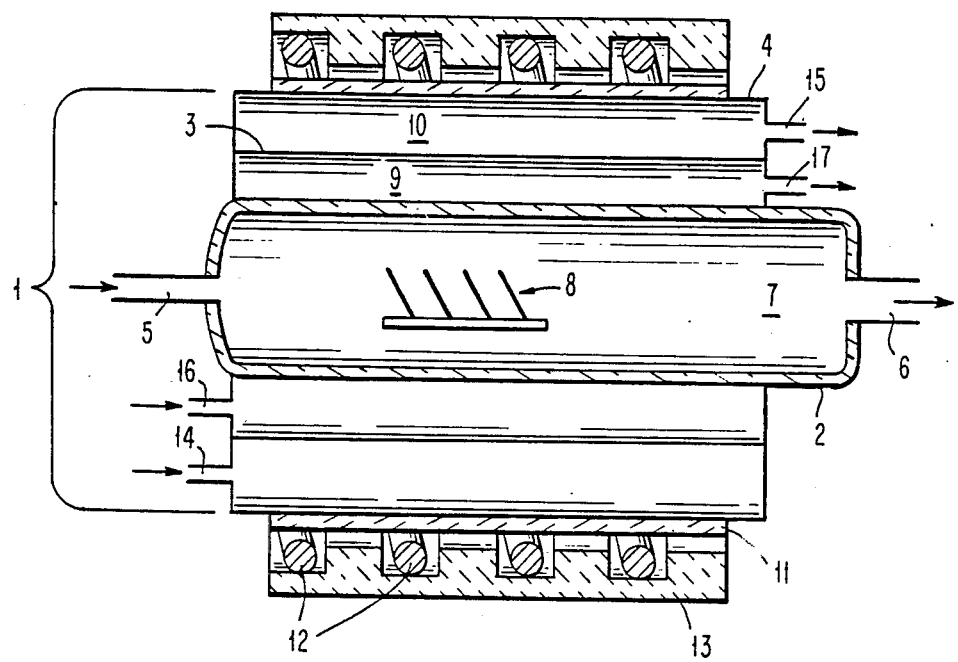

PROCESS AND APPARATUS FOR PRODUCING HIGH PURITY OXIDATION ON A SEMICONDUCTOR SUBSTRATE

This is a division of application Ser. No. 786,194, filed on Oct. 10, 1985, now U.S. Pat. No. 4,606,935.

TECHNICAL FIELD

The present invention is concerned with a process for producing high purity oxidation on a semiconductor substrate and is also concerned with the apparatus for carrying out the process. The present invention is especially concerned with minimizing contaminants so as to provide high purity oxidation on semiconductor substrates.

BACKGROUND ART

In the fabrication of semiconductive devices it is often necessary to provide an insulating oxide layer on the substrate. One way in which the oxidation layer is formed is by heating the substrate in an oxidizing atmosphere in a reaction chamber for a time and at a temperature sufficient to provide the desired oxidation layer. One problem associated with high-temperature oxidation of semiconductor substrates is the contamination of the oxide from impurities occurring in the oxidizing ambient including those metal impurities which diffuse from the furnace heating the ambient through the walls of the reaction chamber.

Contamination of the semiconductor substrate due to alkali metals and transition metals can be harmful as known in the prior art. Such harmful effects caused by various alkali metal contaminants and/or transition metal contaminants include degradation of minority carrier lifetimes; increase of junction leakages; and shifts in the flat band voltage.

It has been suggested to provide an HCl protective atmosphere in an outer chamber around the reaction chamber in order to remove metal contaminants. For instance, such has been suggested in U.K. patent application No. 2082384A and J. Electrochm. Soc., Vol. 130, No. 1, pp. 196-199, Schmidt, "Contamination Free High Temperature Treatment of Silicon or Other Materials", January 1983.

However, such technique has not been entirely satisfactory since it has been found that there is a tendency for some contamination due to water or moisture associated with the halogen ambient or reaction products with the halogen.

SUMMARY OF THE INVENTION

The present invention is concerned with a process for producing high purity oxidation on a semiconductor substrate in a reaction chamber. In particular, the process of the present invention includes heating a semiconductor substrate in the presence of an oxidizing ambient in a multi-walled reaction chamber containing a heating element. The semiconductor substrate is placed in the inner portion of the reaction chamber and an oxidizing ambient is caused to flow through the inner portion of the reaction chamber. A halogen-containing ambient is caused to flow in an outer portion of the reaction chamber intermediate between the inner portion and the heating element. The halogen-containing ambient reacts with heating element contaminant coextensive with the surface of the reaction chamber. A gaseous ambient is caused to flow through an intermediate portion of the reaction chamber positioned intermediate the inner portion and the outer portion. This gaseous ambient removes water by-product of the reaction of the halogen which occurs in the outer portion of the reaction chamber.

In addition, the present invention is concerned with an apparatus for producing high-purity oxidation on a semiconductor substrate in a reaction chamber. In particular, the apparatus of the present invention includes a reaction chamber and a heating element. Also included is contaminant removal means for providing a halogen-based reaction with heating element contaminant coextensive with the surface of the reaction chamber. The contaminant removal means is positioned intermediate the heating element and the reaction chamber. In addition, means are provided for removal of any water by-product of the contaminant removal means. The means for removal of water by-product is positioned intermediate the contaminant removal means and the reaction chamber.

BRIEF DESCRIPTION OF THE DRAWINGS

The FIGURE is a schematic diagram of apparatus in accordance with the present invention.

BEST AND VARIOUS MODES FOR CARRYING OUT THE INVENTION

To facilitate understanding of the present invention, reference is made to the drawing. In the drawing, the triple-walled reaction chamber is designated as numeral 1. The reaction chamber can be in the form of an annular tube which preferably is constructed of high purity vitreous silica. The high purity vitreous silica tube includes an inner cylindrical wall portion 2, an outer cylindrical wall portion 4, and an intermediate cylindrical wall portion 3. Inner wall portion 2 contains openings at 5 and 6 at each end, respectively, and defines a core section 7. In core section 7 are inserted the semiconductor substrates 8 which are to be exposed to the oxidizing ambient. Preferred substrates are silicon wafers. The wafers are suitably supported so as to expose their major surfaces to be oxidized. Intermediate wall portion 3 includes a closure at each end with the inner wall portion 2 whereby there is formed an annular section 9 which is completely isolated from the reaction chamber 7 by the inner wall portion 2. Outer wall portion 4 includes a closure at each end with intermediate wall portion 3 whereby there is formed an annular section 10 which is completely isolated from intermediate portion 9 by the intermediate wall portion 3.

Typical dimensions include an interior diameter of about 2 to about 10 inches for the inner core section; a separation of about 1 to about 2 centimeters between the two walls in the intermediate annular section; and about 1 to about 2 centimeters between the two walls along the annular outer tubular section. Wall thicknesses of about 2 to about 5 millimeters and a length of about 4 to about 10 feet are typical.

Surrounding the reaction chamber 1 is a liner 11, such as aluminum silicate ceramic such as available under the trade designation Mullite; alumina; or zirconia. Such is used to smooth-out the temperature profile and to shield the quartz tube from the resistive heater winding 12 which is supported in slots in the heater support ceramic member 13. The liner is not necessary, but only desirable, and the outer and intermediate wall portion can adequately serve the function of the liner. In addition, provision is made to provide a heating current (not shown) to the winding 12. Also not shown are the various thermocouples that would be or could be included as part of the temperature controls.

The oxidizing agent is caused to flow longitudinally through the inner core section and past the substrates via openings 5 and out through opening 7. The oxidizing agent is preferably dry oxygen gas and/or dry gas mixtures which contain oxygen such as dry air and dry mixtures with diluent gases such as nitrogen and argon. When mixtures containing oxygen are employed such should include at least about 10% and preferably at least about 20% by volume of oxygen. The dry gas should be substantially water free and typically containing about 10 ppm or less and preferably about 1 ppm or less of water.

To assure that the oxidizing gas is dry and as pure as possible, it may be desirable to pass the gas through a molecular sieve filter, followed by heating in an oven at about 900° C. to burn off any organic materials which might be present, and then passing the gas through a trap at about −80° C. to remove water which might still be present.

The wafers are usually maintained at a temperature of about 800° C. to about 1200° C. and preferably about 900° C. to about 1100° C. to achieve the oxidation, typical of which is about 1000° C. Normally, the oxidation takes about 15 minutes to about 3 hours and preferably about ½ hour to about 1 hour to provide a thickness of about 100 angstroms to about 1000 angstroms at about 1000° C. The oxidizing agent is provided at a flow rate of about 1 to about 5 liters/minute for a reaction chamber wherein the inner core section has an interior diameter pf about 3 to 4 inches and is about 7 feet in length.

The halogen-containing ambient is caused to flow through the outer annular tube through inlet 14 and out outlet 15. Any gas mixture suitable of providing halogen at the required temperature can be employed. Examples of which are HCl in dry oxygen and chlorinated hydrocarbons in dry oxygen. Typical chlorinated hydrocarbons include 1,1,1 trichloroethane; 1,1,2 trichloroethane, trichloroethylene, and carbon tetrachloride; preferred of which is 1,1,1, trichloroethane. In general, the gas mixture contains about 1 to 10% by volume of the halogen and about 90 to 99% by volume of the oxygen, typical of which being about 5% by volume of the halogen and about 95% by volume of the oxygen. Of course, mixtures of halogens with the oxygen can be used, if desired. At the temperatures of about 800° C. to about 1100° C., typical of which is about 1000° C., $Cl_2$ and/or flash HCl is formed.

The chlorine and/or flash HCl gas then reacts with any alkali metal or transition metal or other metal that indiffuses from the furnace to thereby form volatile metal halides. These volatile metal halides are then removed from the outer annular tube by the flowing oxygen-containing gas, thereby precluding these metals from diffusing into the inner annular tube and the oxidation tube. The gas mixture is introduced at a rate of about 500 cc/minute to about 1500 cc/minute, typical of which is about 750 cc/minute.

Through the intermediate annular tube is caused to flow gas for removal of any water by-product from the outer annular tube. The gas flows in through inlet 16 and out through outlet 17. The flow rate is about 500 cc/minute to about 1500 cc/minute, typical of which is about 750 cc/minute. The preferred gases are dry air, dry oxygen, and dry nitrogen and mixtures thereof. These gases are usually at temperatures of about 800° C. to about 1100° C., typical of which is about 1000° C. These gases need not be quite as dry as the oxidation gases or oxygen with the halogen, but desirably should be essentially high purity and typically containing 10 ppm of water or less. To assure the desired degree of dryness, the gas to be employed can be passed through a molecular sieve followed by being passed through a trap at about −80° C.

The gas employed prevents water, which is produced from the reaction of the halogen-containing compound with the oxygen to form the chlorine in the outer annular tube, from diffusing into the oxidation tube. This assures a dry oxidation process.

In a typical example, silicon wafers are placed in a reaction chamber having an inner core section with an interior diameter of about 3 to 4 inches and about 7 feet in length. The wafers are heated to a temperature of 1000° C. Dry oxygen gas is passed through the chamber at a rate of about 1 to about 5 liters/minute for about 1 hour. At the same time, a mixture of about 5% by volume of 1,1,1 trichloroethane and about 95% by volume of oxygen is passed through the outer tubular section at a temperature of about 1000° C. at a rate of about 750 cc/minute. Also at the same time dry oxygen is passed through the intermediate annular tube at a temperature of about 1000° C. at a rate of about 750 cc/minute.

The wafers treated are tested for breakdown voltage field failure and demonstrate improved results. Typically, the breakdown voltage field is about $9 \times 10^6$ to $10 \times 10^6$ volts/cm with few low voltage breakdowns. The values obtained are relatively closely distributed.

Having thus described my invention, what I claim as new and desire to secure by Letters Patent is:

1. An apparatus for producing high-purity oxidation on a semiconductor substrate in a reaction chamber whereby the control of diffusant contaminants from the heating element of the reaction chamber is improved, the apparatus comprising;
   a reaction chamber;
   heating element;
   contaminant removal means for providing a halogen based reaction with heating element contaminant coextensive with the surface of said chamber, and said means being positioned intermediate said heating element and said reaction chamber; and
   means for removal of water by-product of said contaminant removal means positioned intermediate said contaminant removal means and said chamber wherein said contaminant removal means and said means for removal of water. By-product each include inlet means and outlet means.

2. The apparatus of claim 1 which further includes a liner surrounding said reaction chamber.

3. The apparatus of claim 2 wherein said liner is selected from the group of aluminum silicate ceramic, alumina, and zirconia.

4. The apparatus of claim 1 wherein said reaction chamber is a quartz tube.

5. The apparatus of claim 1 wherein said contaminant removal means and said means for removal of water by-product are annular tubes.

6. The apparatus of claim 4 wherein said quartz tube has openings at two opposing ends thereof.

7. The apparatus of claim 1 wherein said means for removal of water by-product is completely isolated from said reaction chamber.

8. The apparatus of claim 7 wherein said contaminant removal means is completely isolated from said means for removal of water by-product.

9. The apparatus of claim 8 wherein said reaction chamber has openings at two opposing ends thereof.

* * * * *

UNITED STATES PATENT AND TRADEMARK OFFICE
CERTIFICATE OF CORRECTION

PATENT NO. : 4,674,442

DATED : June 23, 1987

INVENTOR(S) : Samuel E. Blum

It is certified that error appears in the above—identified patent and that said Letters Patent is hereby corrected as shown below:

Column 4, Claim 1, line 48, delete "water. By-product" and insert therefor -- water by-product --.

Signed and Sealed this

Ninth Day of February, 1988

Attest:

DONALD J. QUIGG

*Attesting Officer*     *Commissioner of Patents and Trademarks*